US006924190B2

(12) United States Patent
Dennison

(10) Patent No.: US 6,924,190 B2
(45) Date of Patent: *Aug. 2, 2005

(54) USE OF GATE ELECTRODE WORKFUNCTION TO IMPROVE DRAM REFRESH

(75) Inventor: Charles H. Dennison, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 13 days.

This patent is subject to a terminal disclaimer.

(21) Appl. No.: 10/279,094

(22) Filed: Oct. 24, 2002

(65) Prior Publication Data

US 2003/0052354 A1 Mar. 20, 2003

Related U.S. Application Data

(62) Division of application No. 09/721,697, filed on Nov. 27, 2000, now Pat. No. 6,552,401.

(51) Int. Cl.[7] .......................................... H01L 21/8242
(52) U.S. Cl. ....................... 438/241; 438/289; 438/585
(58) Field of Search ............................... 438/241, 289, 438/585; 257/296, 407, 412, 616

(56) References Cited

U.S. PATENT DOCUMENTS

| 4,366,613 A | * | 1/1983 | Ogura et al. ................ 438/252 |
| 5,260,593 A | | 11/1993 | Lee |
| 5,466,958 A | | 11/1995 | Kakumu |
| 5,534,449 A | * | 7/1996 | Dennison et al. ........... 438/231 |
| 5,824,576 A | | 10/1998 | Doan et al. |
| 5,872,059 A | | 2/1999 | Doan et al. |
| 5,888,867 A | * | 3/1999 | Wang et al. ................ 438/257 |
| 5,930,106 A | | 7/1999 | Deboer et al. |
| 5,952,701 A | | 9/1999 | Bulucea et al. |
| 6,005,801 A | | 12/1999 | Wu et al. |
| 6,030,894 A | | 2/2000 | Hada et al. |
| 6,074,902 A | | 6/2000 | Doan et al. |
| 6,114,206 A | * | 9/2000 | Yu ............................. 438/270 |
| 6,255,160 B1 | | 7/2001 | Huang |
| 6,455,362 B1 | * | 9/2002 | Tran et al. .................. 438/194 |
| 6,552,401 B1 | * | 4/2003 | Dennison .................... 257/375 |

OTHER PUBLICATIONS

Y.V. Ponomarev; Gate–Workfunction Engineering Using Poly–(Si,Ge) for High–Performance 0.18μm CMOS Technology; 1997, IEDM Technical Digest, p. 829–832.
T. Skotnicki, et al.; SiGe Gate for Highly Performant 0.15/0.18μm CMOS Technology.
Hommy C. Hsiao; Advanced Technologies for Optimized Sub–Quarter–Micrometer SOI COMOS Devices, May 1998.
Wen–Chin Lee; Optimized Poly–$Si_{1-x}Ge_x$–Gate Technology for Dual Gate CMOS Application, 1998 Symposium on VLSI Technology Digest of Technical Papers.
Vivian Z–Q Li; Single Gate 0.15 m CMOS Devices Fabricated using RTCVD In–Situ Boron Doped $Si_{1-x}Ge_x$–Gates, IEDM Technical Digest, 1997, p. 833–836.
J. Dunn, et al.; Trends in Silicon Germanium BiCMOS Integration and Reliability, 2000.
IBM's SiGe Technology for Telecommunications and Mi Applications;; <http://www.chips.ibm.com/bluelogic/showcase/sige/whitepaper.html>.
S. Subbanna; Integration and Design Issues in Combining Very–High–Speed Silicon–Germanium Bipolar Transistors and ULSI CMOS for System–on–a–Chip Applications.
Silicon Germanium BiCMOS Technolgy; <http://www.chips.ibm.com/bluelogic/showcase/sige/technology.html>.

* cited by examiner

*Primary Examiner*—Mark V. Prenty
(74) *Attorney, Agent, or Firm*—Dickstein Shapiro Morin & Oshinsky LLP

(57) ABSTRACT

This invention relates to a method and resulting structure, wherein a DRAM may be fabricated by using silicon midgap materials for transistor gate electrodes, thereby improving refresh characteristics of access transistors. The threshold voltage may be set with reduced substrate doping requirements. Current leakage is improved by this process as well.

13 Claims, 3 Drawing Sheets

USE OF GATE ELECTRODE WORKFUNCTION TO IMPROVE DRAM REFRESH

This application is a divisional of U.S. patent application Ser. No. 09/721,697, filed Nov. 27, 2000, now U.S. Pat. No. 6,552,401, entitled USE OF GATE ELECTRODE WORKFUNCTION TO IMPROVE DRAM REFRESH, the entirety of which is hereby incorporated by reference herein.

FIELD OF THE INVENTION

This invention relates to the field of semiconductor memory circuits, and particularly to a method of improving DRAM refresh by using midgap or near midgap materials, such as silicon germanium, in transistor gate electrodes for tuning workfunction and threshold voltages in DRAM access transistors, so as to minimize current leakage.

BACKGROUND OF THE INVENTION

Doping of semiconductor substrates to form semiconductor devices is a well known practice in the art. To form memory devices, not only are the underlying substrate and source and drain regions implanted with dopant, but most often the conductive elements of the transistor gates are doped as well. In modern DRAM processing, typical and almost universal doping patterns for transistors in the prior art include utilizing a N+ doped polysilicon (poly) for the access transistor gates, N+ doped poly for periphery NMOS transistor gates, and N+ doped poly for periphery PMOS transistor gates. A new trend in the industry is to utilize a P+ doped poly for the periphery PMOS transistor gates.

In semiconductor device manufacture, a known problem is that as gate lengths of transistors are scaled to shorter and shorter lengths and gate dielectrics are reduced, the doping levels of the underlying channel region of the substrate must be increased to maintain sufficient access device threshold voltages ($V_t$). Current leakage is a problem with modern memory devices associated with such doping. There are two components to leakage: (1) transistor leakage, which may be reduced by increasing the substrate doping in the channel region, and thus increasing the $V_t$; and (2) diode leakage of the source/drain junction. A major problem is that efforts to alleviate one leakage problem worsens the other. For example, while increasing the channel region substrate doping raises $V_t$ and reduces the transistor leakage problem, it worsens the diode leakage. Hence, when access devices are manufactured by current processes, they must be designed to balance theses two leakage components, which is becoming increasingly more difficult to do. Another problem is that as the array (channel region) doping levels increase in a DRAM array to set sufficient threshold voltage for the access transistor, DRAM refresh characteristics suffer.

To scale the DRAM die size smaller, the transistor gate lengths in both the array and periphery must be reduced. To support the shorter gate lengths and to minimize the power dissipation of increasing DRAM density, the operation voltage is reduced. The lower operating voltage and the reduction in gate length dictate that the gate dielectric is reduced to maintain sufficient switching performance. For NMOS transistors with N+ poly gate electrodes, as the gate oxide is reduced it is required to increase the channel doping to maintain a sufficiently high access threshold voltage.

In DRAM technology, a stored "one" will gradually become a "zero" as electrons refill the empty well. This phenomenon is the leakage described above. The nature of the one transistor DRAM cell is that "ones" gradually become "zeros" and "zeros" remain so. This phenomenon requires that the memory cell be refreshed periodically to maintain the correct data storage at each bit location. The total leakage current of the cell must be low enough that the cell does not discharge and lose its memory state. If a transistor could be designed to have less leakage current, the refresh characteristics of the DRAM would be improved.

It would be useful in DRAM device manufacturing to utilize a method of tailoring transistor threshold voltages specifically for the various transistors that required less channel dopant. It would be preferable if this tailoring of $V_t$ could be accomplished while reducing the memory array substrate channel doping levels so as to minimize current leakage and improve refresh characteristics. Additionally, use of novel materials, that could be readily incorporated into standard DRAM processing, for transistor gate electrodes to accomplish the above would be advantageous.

SUMMARY OF THE INVENTION

This invention relates to a method of forming a DRAM structure and the resulting structure. This method uses selected amounts of silicon midgap or near midgap materials for transistor gate electrodes, and thus tailors the workfunction of the gate electrodes. In so tailoring the workfunction of the gate electrodes, a DRAM memory device can be formed with a threshold voltage set to a sufficiently high level, while allowing an accompanying reduction in the array substrate channel doping requirements for a given target $V_t$ of the DRAM transistor. By this method, novel DRAM access and periphery logic transistors may be formed, having a threshold voltage tailored to a sufficient level, with accordingly reduced channel region substrate doping, resulting in minimized transistor and diode current leakage, and ultimately effectuating improvements in the refresh characteristics of the DRAM device.

These and other features and advantages of the invention will be more clearly understood from the following detailed description of the invention which is provided in connection with the accompanying drawings.

DETAILED DESCRIPTION OF THE PREFERRED EMBODIMENTS

DRAM memory circuits are currently the most popular type of memory circuits used as the main memory of processor-based systems. Therefore, the invention will be discussed in connection with DRAM memory circuits. However, the invention herein disclosed has broader applicability and is not limited to DRAM memory circuits. It may be used in any other type of MOS transistor circuit, in which it is desired to reduce the amount of dopant required to run sufficiently high threshold voltages, and so as to minimize current leakage. Particularly applicable to DRAM technology, however, is the characteristic of the invention that refresh characteristics of a DRAM memory device can be improved.

Also, the terms "wafer" and "substrate" are used interchangeably and are to be understood as including silicon, silicon-on-insulator (SOI), and silicon-on-sapphire (SOS) technology, and other semiconductor structures. Furthermore, references to a "wafer" or "substrate" in the following description, do not exclude previous processing steps utilized to form regions or junctions in or on the base semiconductor structure or foundation.

No particular order is required for the method steps described below, with the exception of those logically requiring the results of prior steps. Accordingly, while many of the steps discussed below are discussed as being performed in an exemplary order, this order may be altered.

The present invention provides a method of forming a DRAM having a memory array access transistor and periphery logic transistors on an integrated circuit. These transistors follow standard MOS transistor processing steps, but with materials alternatives for the transistor gate electrodes. During processing, the transistor gate electrodes can be formed incorporating silicon (Si) midgap or near midgap (hereinafter midgap) materials. Such materials refer to those having a workfunction falling between that of P+Si and N+Si, or more specifically, between the conduction band and valence band of Si. These materials include those such as Si/Ge, TiN/W, Al/TiN, and Ti/TiN, all of which are commonly used in semiconductor devices. By altering the mole fraction of the midgap material used in a given transistor gate electrode, the workfunction of the electrode is tailored, thus the threshold voltage can be tailored and increased without necessitating any increase in underlying channel doping levels. Consequently, standard $V_t$ may be achieved using a reduced channel doping. This helps in reducing current leakage and improves access transistor refresh characteristics.

Figure 1:
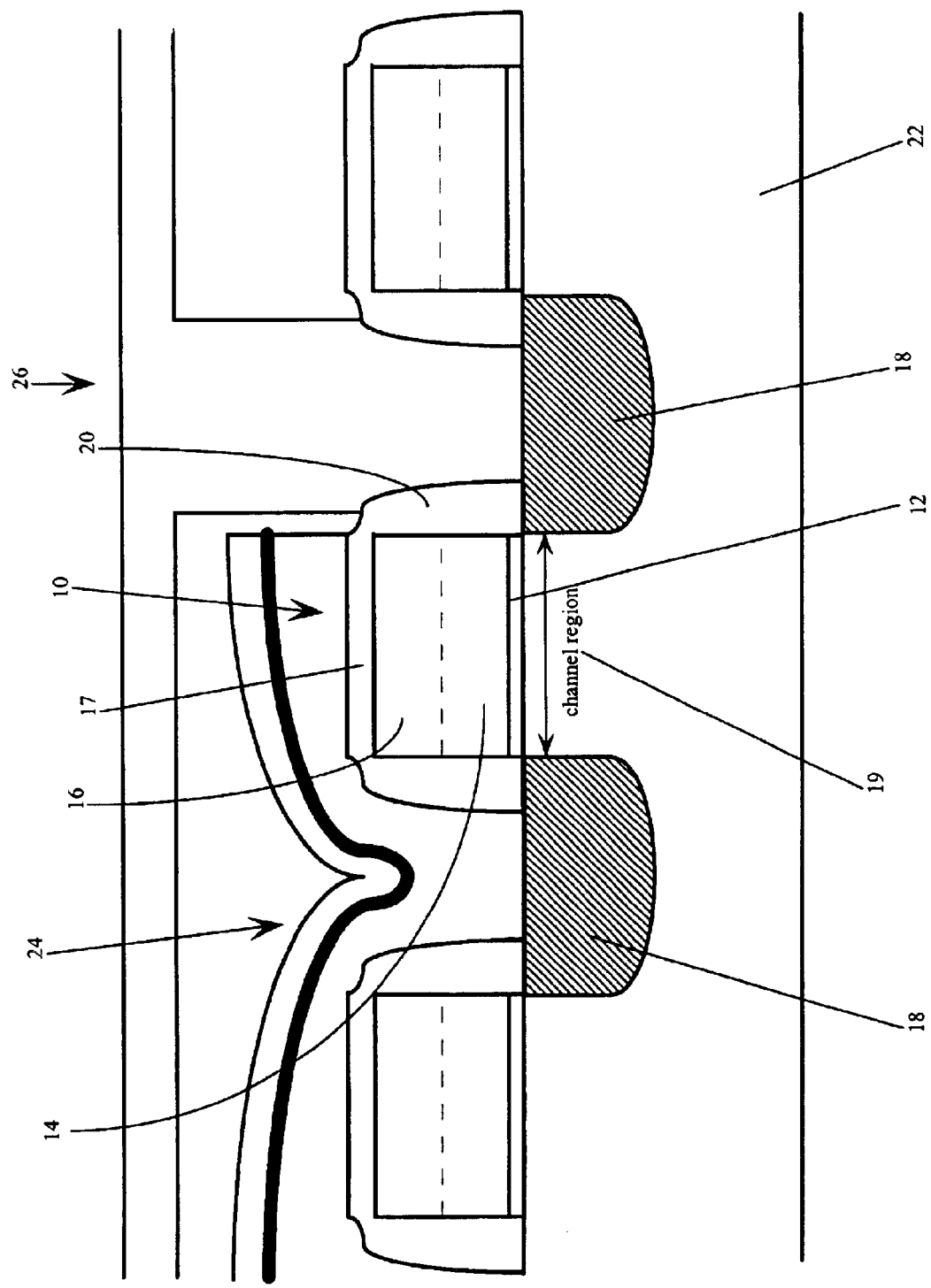
FIG. 1 is an illustration of an access transistor formed in accordance with the invention.

Referring now to the drawings, where like elements are designated by like reference numerals, in accordance with the process of the invention, an access transistor of a DRAM can be formed as shown in FIG. 1. FIG. 1 shows a conventional DRAM memory device, but the process of the invention modifies this structure by using midgap materials for the gate electrode to tailor its workfunction. An access transistor gate stack 10, source and drain regions 18, and any subsequent devices, are formed substantially as known in the art, with novel variations as described below. Because the materials for transistor gate electrodes utilized in accordance with this invention are readily integrated into standard MOS processing, all processing steps according to this invention can be performed as is known in the art.

The access transistor is formed over a substrate 22, preferably silicon or a compound including silicon (Si) and germanium (Ge), with a surface upon which the gate structure 10 rests. The access transistor gate stack 10 includes a bottom gate oxide 12, a gate electrode 14/16 comprising a midgap material, a gate top insulator cap 17, and side oxide, or nitride, spacers 20. The entire gate electrode, parts 14 and 16, may comprise the midgap material, or the bottom portion 14 may comprise the midgap material while the top portion 16 comprises polysilicon or some other conductive material. The processing steps utilized in forming the gate electrode 14/16 to achieve the advantages of the invention are discussed below. On either side of the gate stack 10 are source and drain regions 18 to form a transistor. The gate stack 10 is positioned between the source and drain regions 18, forming a channel region 19 between the source and drain regions 18. A memory cell is completed with the capacitor 24, and the bit line and plug 26.

Figure 2:
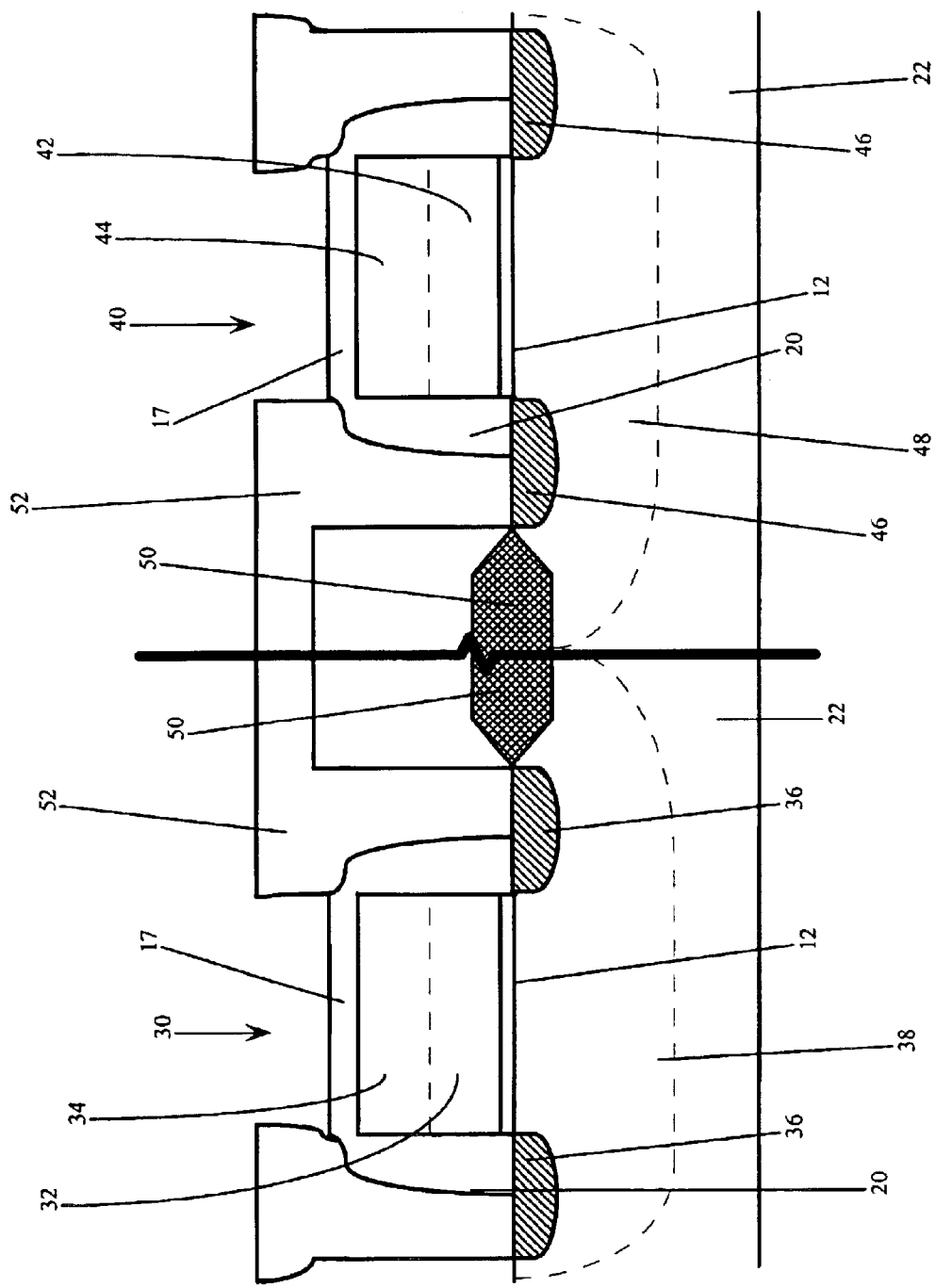
FIG. 2 is an illustration of periphery transistors formed in accordance with the invention.

Also in accordance with the invention, periphery logic transistors can be formed as shown in FIG. 2. Again, FIG. 2 shows conventional transistor structures, but the process of the invention modifies these structures by using midgap materials for the transistor gate electrodes as will be further discussed below. These gate structures can include a periphery NMOS transistor gate stack 30 and a periphery PMOS transistor gate stack 40. These NMOS and PMOS transistors are formed over the same substrate 22, and can be on the same integrated circuit, as the access transistor gate stack 10 shown in FIG. 1. The periphery NMOS and PMOS transistor gate stacks 30, 40 include a gate oxide 12, a NMOS gate electrode 32/34 comprising a midgap material or a PMOS gate electrode 42/44 comprising a midgap material, a gate top insulator cap 17, and side oxide, or nitride, spacers 20. As with the access transistor described above, the entire gate electrode of each transistor, portions 32 and 34, and portions 42 and 44, can comprise the midgap material. Alternatively, the bottom portions of the gate electrodes 32 and 42 can comprise the midgap material, while the top portions 34 and 44 comprise polysilicon or another conductive material. On either side of the NMOS gate stack 30 are N-type source and drain regions 36 to complete the periphery NMOS transistor. On either side of the periphery PMOS gate stack 40 are P-type source and drain regions 46 to complete the periphery PMOS transistor. Each transistor can be isolated within the substrate 22 by a FOX (field oxide) region 50. The periphery logic circuits can be completed by interconnect lines 52.

By using midgap materials, such as silicon germanium (Si/Ge), for the DRAM array and periphery logic transistor gate electrodes and manipulating the mole fraction of this material in accordance with the invention, the workfunction of the gate electrodes can be tailored and the concentrations of dopants necessary to form the memory and logic device channels to achieve a desired threshold voltage can be less than is required in the prior art, thereby decreasing current leakage and improving refresh characteristics of the DRAM memory array. Additionally, in accordance with this invention, it is also possible to utilize P+ polysilicon alone for the memory array transistor gate electrode to similarly reduce the memory array channel dopant requirements; essentially using a "zero" mole fraction of the midgap material.

Before an MOS (metal oxide semiconductor) transistor structure, such as those described herein, is formed, the electrons in the semiconductor and the gate metal (or polysilicon) are at different potentials with respect to a vacuum (common reference). When the materials are brought together, equilibrium must be achieved in the system.

This equilibrium is naturally achieved by the flowing of electrons to regions of lower potential until an internal electric field is built up, thus forming a depletion region, which balances the original electric-potential difference. The difference between the electron potentials in the metal or polysilicon, used for the transistor gate electrodes, as compared to the silicon substrate must be considered when setting the device $V_t$ and performing the silicon substrate doping. Hence, the electron potential in the metal or poly, with respect to the vacuum, plays a factor in determining the final $V_t$ of the device, as well as determining related characteristics. Furthermore, the potential (workfunction) in the metal/poly is a characteristic property of the material itself. The use of different materials, such as those described herein, can increase a transistor's $V_t$, thereby allowing an accompanying reduction in the substrate doping for a given target $V_t$. This results in improved access transistor refresh.

Use of non-traditional materials, such as polycrystalline Si/Ge, for gate electrode materials for access transistors, and periphery NMOS and PMOS transistors, provides a minimized poly-depletion effect and boron penetration, and the gate workfunction may be tailored by controlling the Ge (or other midgap material) mole fraction in relation to the Si/Ge. By changing the Ge (or other midgap material) mole fraction in the poly-Si/Ge films used here, a threshold voltage ($V_t$) adjustment may be achieved with reduced channel doping levels for a given gate oxide thicknesses. By this process, improved current drive and transconductance may be achieved in the silicon germanium gate devices compared to traditional polysilicon gate devices. These improvements in materials technology can be readily implemented into standard DRAM processing. In such a DRAM device, refresh is improved.

DRAM refresh is improved by this tailoring of the workfunction of the access transistor, which allows for less boron dopant enhancement implant. By using a mole fraction of 0.0 to 0.7 Ge for P+ type gate electrodes for access transistors, such work function tailoring is achieved, thereby enabling a sufficient threshold voltage for the transistor while using less dopant, as compared to the N+ polysilicon gate electrodes currently used in the art. The less germanium used in a silicon germanium gate electrode, the less enhancement implant needed for a given $V_t$, but the worse the short channel effects (worse punch through) for the access transistor will be. Conversely, using more germanium for a higher mole fraction requires a higher dopant concentration, but provides superior short channel effects. Thus, for a given technology (gate length, operating voltage, design of the memory array S/D structure including LDD design, etc.), there will be an optimum value of Ge mole fraction. For standard DRAM technology, nominal 0.3 Ge and 0.7 Si provides the desired improved refresh characteristics and appropriate $V_t$ with reduced leakage.

By utilizing the materials and process of the invention, the step of masking and re-implanting the wafer with boron for an enhancement implant to selectively increase the memory array transistor gate $V_t$, which would normally be performed in the prior art, can be omitted, thereby reducing the overall number of processing steps required. In the prior art, this step would be performed to help set the $V_t$ of the memory array access transistors. This boron implant would increase the doping of the regions under the transistor gates, which form channels 19. Because of the novel use of midgap materials for gate electrodes, the invention makes such additional implanting potentially unnecessary and provides for fewer steps, while resulting in devices with improved leakage and refresh characteristics, while maintaining other standard performance levels.

Transistor gates are formed as shown in FIGS. 1 and 2. It is possible to form all transistors, including the periphery NMOS and PMOS transistors, by this process, but it will here be explained using DRAM access transistor processing as an example.

The materials for the gate electrode 14/16 are deposited over gate oxides 12. Use of midgap materials for at least a portion (14) of the gate electrode 14/16 is necessary to adjust the workfunction of the gates in accordance with the invention. A good example of a midgap material that may be utilized in accordance with this invention is silicon germanium (Si/Ge). Silicon germanium may be used alone, or incorporated with a polysilicon upper-layer 16, as the gate electrode material for DRAM transistors. Silicon germanium can be readily integrated as a gate material into existing DRAM technology to achieve significant increases in transistor performance. This will be the exemplary embodiment used for exemplary purposes.

The Ge mole fraction of the poly-Si/Ge gate electrode 14/16 is optimized from about 0.2 to 0.7 Ge mole fraction. Ge is a neutral species suitable for both P and N-type transistors. By tuning the Ge mole fraction, the desired threshold voltage value can be set, and channel dopings for access transistors, and NMOS and PMOS periphery transistors can be optimized to improve refresh considerations as discussed. The target array transistor $V_t$ should be tailored by this method to be about 200–800 mV higher than the counterpart periphery NMOS transistor.

The completed DRAM access transistor gate stack 10 will have the structure illustrated in FIG. 1, wherein the gate electrode 14/16 can be entirely composed of Si/Ge, or alternatively, the bottom portion of the electrode 14 can be Si/Ge while the top portion of the gate electrode 16 is a doped polysilicon or other conductive layer. The fabrication of this gate structure can be accomplished by deposition of the Si/Ge by rapid thermal chemical vapor deposition (RTCVD) or by LPCVD. A gas mixture comprising $Si_2H_6$ and $GeH_4$ may be used.

It is also possible to implant the desired amount of Ge into a pre-deposited layer of polysilicon. This is accomplished by a very high dose Ge implantation (many atomic % of Ge, similar to SIMOX dose levels).

If it is desired to utilize a polysilicon cap layer 16 over the Si/Ge gate electrode layer 14, this may be accomplished by conventional processing as known in the art. Such a cap 16 may be desired for just such a purpose: to remain as close as possible to conventional polysilicon gate processing. To form this polysilicon layer, low pressure chemical vapor deposition (LPCVD) may be used. Siliane gas ($SiH_4$) is used to form this layer of the transistor gate. It is also possible to replace or add to this cap layer 16 with a more conductive material such as a silicide.

After the formation of the gate oxide 12, the midgap transistor gate electrode 14, and the cap layer 16 (if desired), the top layer of the access transistor gate stack 10, the dielectric cap 17, is formed. After the forming of this dielectric cap layer, the gate stacks can be patterned and etched as known in the art. Next, the source and drain regions 18 can be formed by ion implantation and gate oxide spacers 20 can be formed as is known in the art to complete the access transistor as shown in FIG. 1. After the fabrication of the gate and source and drain regions, subsequent processing can continue as known in the art, including the forming of capacitors 24, bit lines and plugs 26, and cell metallization (not shown).

As an alternative processing method, the transistors can be fabricated utilizing the method described in U.S. Pat. No. 5,824,576, incorporated herein by reference. This process allows for a reduction in the number of related masking steps. The midgap or near midgap materials discussed herein can be incorporated into this alternative processing method so that the transistor gate electrode workfunctions and threshold voltages are tailored in a similar fashion to that discussed above to allow a reduction in doping requirements and improved device current leakage characteristics.

Figure 3:
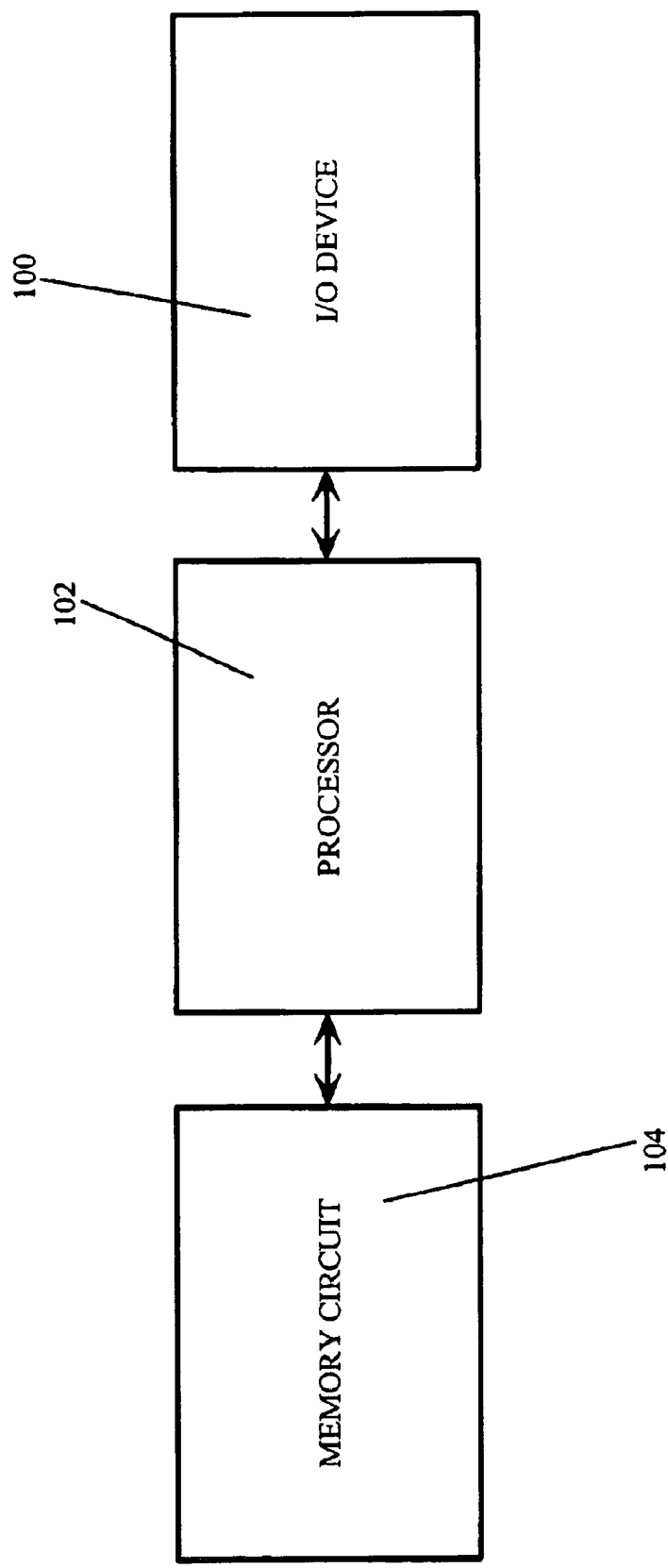
FIG. 3 is a depiction of a processor based system incorporating the transistors shown in FIG. 1 and FIG. 2.

FIG. 3 illustrates a processor system (e.g., a computer system), with which a memory having a memory cell area and a periphery logic area as described above may be used. The processor system comprises a central processing unit (CPU) 102, a memory circuit 104, and an input/output device (I/O) 100. The memory circuit 104 contains a DRAM, or other memory device, including semiconductor devices constructed in accordance with the present invention. Also, the CPU 102 may itself be an integrated processor, which utilizes semiconductor devices constructed in accordance with the present invention, and both the CPU 102 and the memory circuit 104 may be integrated on a single chip, so as to fully utilize the advantages of the invention.

ALTERNATIVE EMBODIMENTS

In each embodiment set forth below, the specific structure may be achieved by utilizing the processing methodology described above in relation to FIGS. 1–3. These alternative embodiments are intended to further describe the invention. They are not intended to limit the scope of the invention to any single embodiment or combination.

For each embodiment described below, the range of mole fraction for the midgap material can range from 0.0 to 0.7 Ge for the access transistors. The preferred ratio is 0.3 Ge to 0.7 Si for the gate electrode materials. The access transistors are NMOS type transistors.

Embodiment 1

In the first embodiment, the semiconductor device structure has access transistors comprising P+ Si/Ge gate electrodes 14, periphery NMOS transistors comprising P+ Si/Ge gate electrodes 32 and periphery PMOS transistors comprising P+ Si/Ge gate electrodes 42.

Embodiment 2

In the second embodiment, the semiconductor device structure has access transistors comprising P+ Si/Ge gate electrode 14, a majority of periphery NMOS transistors comprise N+ Si/Ge gate electrodes 32, and a minority of periphery NMOS transistors comprise P+ Si/Ge gate electrodes 32, and a majority of the periphery PMOS transistors comprise P+ Si/Ge gate electrode 42, and a minority comprise N+ Si/Ge gate electrodes 42.

Embodiment 3

For the third embodiment, the semiconductor device structure has access transistors comprising either N+ or P+ Si/Ge gate electrodes 14, a majority of periphery NMOS transistors comprise a N+ poly gate electrodes 32, and may have a minority comprise either P+ poly or Si/Ge gate electrodes 32, and periphery PMOS transistors comprise either P+ poly or N+ poly gate electrodes 42.

Embodiment 4

For the fourth embodiment, the semiconductor device structure has access transistors comprising P+ poly gate electrodes 14, periphery NMOS transistors comprising N+ poly gate electrodes 32, and periphery PMOS transistors comprising P+ poly gate electrodes 42. This embodiment essentially has a 0.0 mole fraction of Ge and may result in the conversion of the access transistor from a surface channel device to a potentially buried channel device, resulting in added challenges to minimize access transistor leakage. However, this embodiment requires the least amount of boron implant, and may even require an N-type array implant adjust. With the use of very steep implants, such as antimony or arsenic, for the $V_t$ adjust and very shallow LDDs along with a boron deep punchthrough implant, it is possible to make it an access transistor with acceptable characteristics of acceptable the drain to source leakage. Also the use of a negative voltage wordline in the off state may enable this process, allowing better "off" characteristics and less leakage.

The above description and accompanying drawings are only illustrative of exemplary embodiments, which can achieve the features and advantages of the present invention. It is not intended that the invention be limited to the embodiments shown and described in detail herein. While the invention has been illustrated primarily with Si/Ge, other materials, such as TiN/W, Al/TiN, and Ti/TiN, can also be used. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A method of forming an integrated circuit device, comprising:
    forming an access transistor, a gate electrode of said access transistor comprising a midgap material comprising at least two material components;
    forming at least one NMOS periphery transistor, said at least one NMOS periphery transistor comprising a gate electrode layer comprising a midgap material having at least two material components; and
    forming at least one PMOS periphery transistor, said at least one PMOS periphery transistor comprising a gate electrode layer comprising a midgap material having at least two material components, wherein the workfunction of each said gate electrode is set at least in part by the mole fraction of said midgap material components in said gate electrodes, and
    wherein the step of forming an access transistor further comprises the step of depositing a layer of polysilicon over said midgap material.

2. The method of claim 1, further comprising the step of forming a dielectric layer over said polysilicon layer.

3. The method of claim 1, wherein the step of forming an access transistor further comprises the step of forming a layer comprising silicide over said midgap material.

4. A method of forming an integrated circuit device, comprising:
    forming an access transistor, a gate electrode of said access transistor comprising a midgap material comprising at least two material components;
    forming at least one NMOS periphery transistor, said at least one NMOS periphery transistor comprising a gate electrode layer comprising a midgap material having at least two material components; and
    forming at least one PMOS periphery transistor, said at least one PMOS periphery transistor comprising a gate electrode layer comprising a midgap material having at least two material components, wherein the workfunction of each said gate electrode is set at least in part by the mole fraction of said midgap material components in said gate electrodes, and
    wherein the step of forming said gate electrode layer of at least one of said periphery transistors comprises depositing a layer of midgap material comprising silicon germanium.

5. The method of claim 4, wherein said deposited layer of midgap material has a mole fraction in the range of about 0.2 to about 0.7 Ge.

6. A method of forming an integrated circuit device, comprising:
    forming an access transistor, a gate electrode of said access transistor comprising a midgap material comprising at least two material components;

forming at least one NMOS periphery transistor, said at least one NMOS periphery transistor comprising a gate electrode layer comprising a midgap material having at least two material components;

forming at least one PMOS periphery transistor, said at least one PMOS periphery transistor comprising a gate electrode layer comprising a midgap material having at least two material components, wherein the workfunction of each said gate electrode is set at least in part by the mole fraction of said midgap material components in said gate electrodes; and doping a channel region in said substrate corresponding to each of said access, NMOS and PMOS transistors.

7. The method of claim 6, further comprising the step of doping each said channel region, wherein the amount of doping depends on the mole fraction of the material components of said midgap material in said gate electrode layer.

8. The method of claim 6, wherein two of said at least two material components are silicon and germanium.

9. A method of forming an integrated circuit device, comprising:

forming an access transistor, a gate electrode of said access transistor comprising a midgap material comprising at least two material components;

forming at least one NMOS periphery transistor, said at least one NMOS periphery transistor comprising a gate electrode layer comprising a midgap material having at least two material components; and forming at least one PMOS periphery transistor, said at least one PMOS periphery transistor comprising a gate electrode layer comprising a midgap material having at least two material components, wherein the workfunction of each said gate electrode is set at least in part by the mole fraction of said midgap material components in said gate electrodes, and wherein said gate electrode layer of said at least one NMOS transistor and said PMOS transistor further comprises polysilicon.

10. A method of forming an access transistor for an integrated circuit device, said method comprising:

forming an oxide layer over a semiconductor substrate;

forming a gate electrode layer comprising a midgap material containing at least two material components over said oxide layer, wherein a threshold voltage of said gate electrode of said access transistor is set at least in part by the mole fraction of said midgap material components, said forming a gate electrode comprising forming a layer of silicon germanium by chemical vapor deposition;

forming a conductive cap layer over the gate electrode layer; and forming a dielectric layer over said conductive cap layer.

11. The method of claim 8, wherein the step of forming a layer of silicon germanium comprises the acts of:

depositing a layer of polysilicon; and implanting germanium into the polysilicon layer.

12. The method of claim 10, wherein the layer of silicon germanium has a mole fraction within the range of about 0.2 to about 0.7 Ge.

13. The method of claim 1, wherein two of said at least two material components are silicon and germanium.

* * * * *